United States Patent [19]
Chandna et al.

[11] Patent Number: 5,490,105
[45] Date of Patent: Feb. 6, 1996

[54] HIGH SPEED CURRENT MIRROR MEMORY CELL ARCHITECTURE

[75] Inventors: Ajay Chandna, Ann Arbor; Richard B. Brown, Ann Arbort, both of Mich.

[73] Assignee: Regents of the University of Michigan, Ann Arbor, Mich.

[21] Appl. No.: 312,823

[22] Filed: Sep. 27, 1994

[51] Int. Cl.$^6$ .................................................. G11C 11/00
[52] U.S. Cl. ........................................... 365/156; 365/190
[58] Field of Search .................................... 365/154, 156, 365/190, 174

[56] References Cited

U.S. PATENT DOCUMENTS 4,725,981  2/1988  Rutledge ................... 365/154

*Primary Examiner*—A. Zarabian
*Attorney, Agent, or Firm*—Brooks & Kushman

[57] ABSTRACT

A memory cell (i.e. CMMC) for use in GaAs circuits such as MESFETs wherein read and write operations can both be performed using as few as two access transistors biased as current mirrors to driver transistors of the cell. This new memory cell offers larger read access currents for faster access times and also faster write times than in a conventional memory cell. This cell does not require that the driver transistors be scaled with respect to the access transistors, resulting in a smaller cell area. In the CMMC, the gate of each access transistor is biased by a storage node voltage. The source node of each access transistor is biased by a word line which is pulled low, towards ground. As a result, each access transistor has a gate-source voltage of $$V_{GS}(access) = V_{CS} + V_{CG} - V_{WORD}$$

where $V_{CS}$ is the cell storage voltage (with respect to cell ground), $V_{CG}$ is the cell ground voltage and $V_{WORD}$ is the word line voltage at the cell. By varying the cell ground voltage, the memory cell can be biased for read or write operations. By adjusting both the cell ground and word line voltages, additional control can be gained over the read access current and access time.

8 Claims, 8 Drawing Sheets

HIGH SPEED CURRENT MIRROR MEMORY CELL ARCHITECTURE

TECHNICAL FIELD

This invention relates to memory cells and, in particular, to memory cells for use in GaAs circuits.

BACKGROUND ART

If GaAs is to have an impact on the digital integrated circuit market, it must be able to incorporate adequate amounts of high-speed memory on chip. High speed GaAs microprocessors developed to date have integrated only small amounts of memory on chip. Future designs will require large sub-2 ns on-chip caches.

To prevent destructive readout, a conventional memory cell, as illustrated in FIG. 1, requires driver transistors that are three times larger than the access transistors. To achieve high access speeds, however, relatively large access transistors are necessary. Since the only function of the driver transistor is to maintain the state of the cell, the driver transistors in conventional cells are larger than minimum size, while the access transistors are smaller than desired.

The article by Fiedler et al entitled "A GaAs 256×4 Static Self-Timed Random Access Memory" *IEEE GaAs IC Symposium Tech. Digest,* November, 1986, disclosed a memory cell which utilizes current mirrors for a read operation but also requires additional devices to performs a write operation.

SUMMARY OF THE INVENTION

An object of the present invention is to provide a memory cell architecture for GaAs circuits wherein the cell can deliver much larger access current for readout than a conventional cell of the same area and cell power.

Another object of the present invention is to provide a memory cell architecture for GaAs circuits wherein the cell is immune to the possibility of destructive read associated with conventional cells which typically include six transistors.

Still another object of the present invention is to provide a memory cell architecture for GaAs MESFETs wherein biasing of the cell minimizes the impact of leakage circuits on the number of bits that can be safely connected to a column.

In carrying out the above objects and other objects of the present invention, an improved memory cell for a GaAs circuit is provided. The cell includes two storage nodes for storing change, each of the storage nodes having a voltage, and two access transistors, each of the access transistors having a source, a gate and a drain. The cell also includes two driver transistors coupled to the access transistors. Each of the driver transistors has a gate, a source and a drain. Each of the access transistors is adapted to be biased as a current mirror to its associated driver transistor so that a gate-source voltage of each driver transistor is substantially the same as a gate-source voltage of its associated access transistor. The cell further includes a cell ground line connected to the sources of the driver transistors. The cell ground line has a variable voltage to allow a write operation to the cell to occur when raised and to allow a read operation from the cell to occur when lowered.

Preferably, the cell includes a word line connected to each of the access transistors. Each access transistor is adapted to be biased by the word line so that when the word line is pulled low towards ground, the access transistor has a gate-source voltage defined by the equation:

$$V_{GS}(access) = V_{CS} + V_{CG} - V_{WORD}$$

where $V_{CS}$ is the cell storage voltage (with respect to cell ground), $V_{CG}$ is the cell ground voltage and $V_{WORD}$ is the word line voltage at the cell.

The advantages of a memory cell constructed in accordance with the present invention are numerous. For example, simulations show that the cell can deliver at least three to four times as much access current as a conventional cell. This increase translates into an increase of about 25–50% in overall maximum speed of operation for memory arrays of size 4 kb to 16 kb.

This new cell is more immune to the possibility of destructive read associated with conventional cells. The biasing of this cell minimizes the impact of leakage currents on the number of bits that can be safely connected to a column. Measurements indicate a SRAM constructed with such cells can work with up to 512 bits per column at 75° C.

In addition to faster read times, this cell can be written to much faster than conventional memory cells. Simulations show that write time for this cell can be as much as 500 ps faster than the write time to conventional cells.

The relative simplicity of this cell removes the write-after-read hazard of conventional cell architecture and also eliminates the need to limit bit-line swing during read to prevent destructive writing.

This new memory cell is useful in building faster static memories used in computer CPUs with cache RAM, test equipment, graphics and signal processors.

The above objects and other objects, features, and advantages of the present invention are readily apparent from the following detailed description of the best mode for carrying out the invention when taken in connection with the accompanying drawings.

BEST MODE FOR CARRYING OUT THE INVENTION

Figure 2:
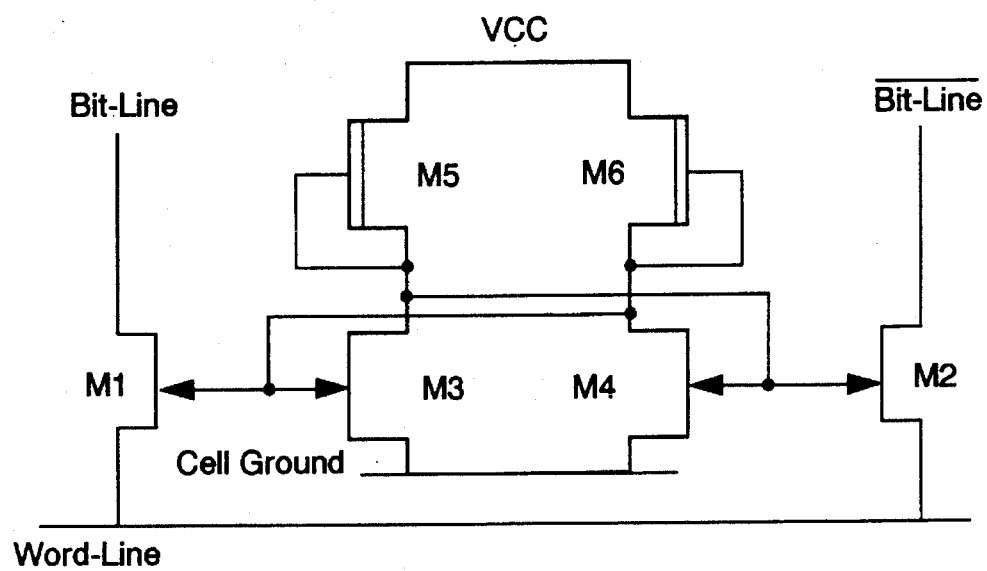
FIG. 2 is a schematic diagram of a current mirror memory cell (CMMC) constructed in accordance with the present invention.

Referring again to the drawing figures, FIG. 2 shows a current mirror memory cell (CMMC) of the present invention, which is designed to allow its driver transistors to be of a minimum size, while permitting its access transistors to be sized independently of the driver transistors. A cell of a given area and power is thus provided with a larger access current. The cell is also immune to the destructive read problems and read/write trade-offs associated with a conventional memory cell as described in detail hereinbelow.

Read Operation Of The CMMC

Figures 3A, 3B:
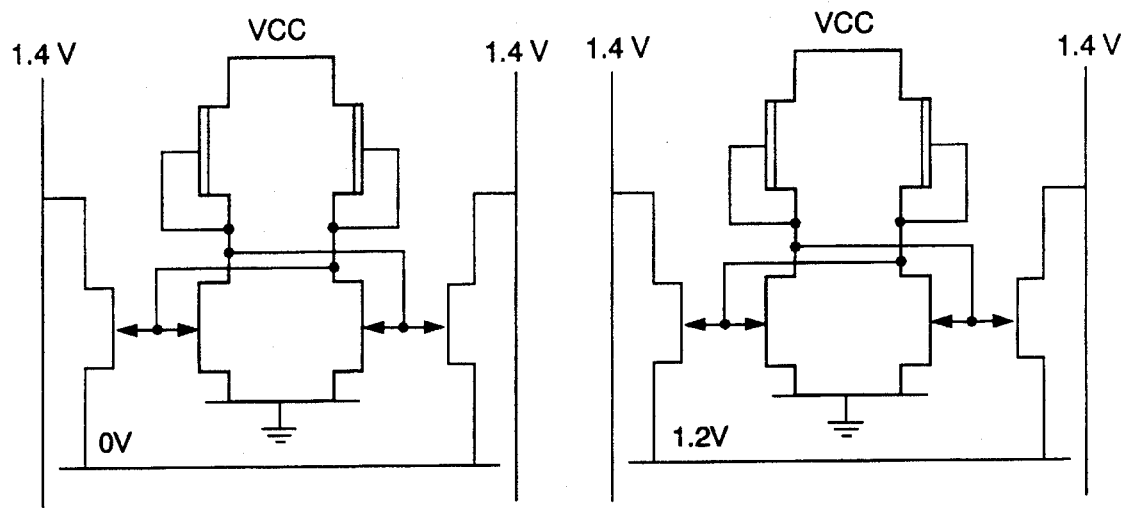
FIGS. 3a and 3b are schematic diagrams of CMMC cell bias during read operation for a selected cell and all other cells, respectively.

During a read operation, the various signal lines of the cell are biased as illustrated in FIG. 3a. Both bit-lines are initially at two diode drops above ground, or approximately 1.4 V. The cell-ground line is a common ground signal for a given row. During the read operation, all cell-ground lines are biased at 0 V. The word line for the selected row is lowered to 0 V, while the remaining word lines are held at approximately 1.2 V as illustrated in FIG. 3b.

The access transistors of a selected memory cell, shown in FIG. 3a, are biased as current mirrors to the driver transistors. The gate-source voltages of the driver transistors and the attached access transistors are equal, while the drain-source voltages are different. The gate-source diodes (storage node to word-line) of the access transistors appear merely as an additional diode load to the memory cell. The gate-drain diodes (storage node to bit-lines) are reverse-biased and appear as additional capacitance to the storage nodes. Since the access transistors cannot inject current into the storage nodes, this read operation is essentially non-destructive. As a result, the access transistors can be sized independently of the driver transistor without possible fear of destructive readout.

Previous efforts in GaAs have also used current mirror transistors for readout. These implementations have involved more complex memory cells with different write schemes.

A. Leakage Currents

In a conventional GaAs memory, as the number of cells attached to a column is increased, leakage currents through nonselected access transistors can overwhelm the active current of the selected cell. Various methods have been proposed to reduce this problem for conventional memory cells.

The biasing arrangement of the CMMC minimizes this leakage current problem. For simplicity, the above description of the cell assumed that the cell ground and word line voltages were brought down to 0 V. This would require impractically large pull-down transistors in the cell ground and word line drivers which are actually designed to bring these signals down to approximately 0.1–0.2 V. The memory cell storage nodes are at approximately 0.2 V and 0.8 V. The word lines remain at their standby bias of 1.2 V. The bit-lines are initially at about 1.4 V. As a result, both the gate-source and gate-drain diodes of the access transistors are reverse-biased by at least 0.4 V. This arrangement minimizes the drain-source and drain-gate components of leakage current that flow onto the bit-lines. In the Vitesse process, this biasing arrangement allows a maximum of 512 memory cells to be safely connected to a column at 75° C., compared to a maximum of only 32 using conventional 6-transistor cells without negative gate-source bias.

B. Non-Destructive Readout

The most obvious advantage of the CMMC is that there is no possibility of destroying the state of the cell during readout. In a conventional memory cell, when the word line is asserted high, two mechanisms cause noise to be injected into the cell. First, the low and high nodes of the cell become capacitively coupled to the bit-lines. Second, current is injected into the cell through the gate-source diode of the access transistor. This current injection is the more important mechanism and can make the state of the memory cell flip, causing destructive readout. As noted above, in order to minimize the possibility of destructive read, the driver transistors are typically made three times as wide as the access transistors. Destructive readout has been identified as an important yield limiting factor for GaAs SRAMs.

When the word line of the CMMC is raised, charge is injected into both cell storage nodes through the non-linear gate-to-source capacitance. During this transition, the state of the cell is actually reinforced. When the word line is lowered, charge is removed from both storage nodes. The magnitude of this charge is small enough that even with an edge rate as low as 100 ps on the word line and with cell currents as low as 10 µA the cell will not be upset.

C. Access Current

The access currents of both the CMMC and a conventional memory cell are drain currents of the access transistors. This current is given by:

$$I_{DS}=K.(V_{GS}-V_{TH})^2.(1+v(V_{GS}-V_{TH})^{-1}).(1+\lambda V_{DS}).\tanh(\alpha V_{DS}) \quad (1)$$

where K is the transistor transconductance, $V_{TH}$ is the threshold voltage, b is a velocity saturation parameter, $\lambda$ is a channel length modulation parameter, and $\alpha$ is the drain voltage multiplier.

The CMMC is capable of providing much larger access transistor drain currents for faster readout than a conventional memory cell of the same area. This is due to two factors.

In a conventional cell, an access transistor of width 2 µm would require a 6 µm wide driver transistor. The CMMC allows a 6 µm wide access transistor while using only a 2 µm wide driver transistor. The area of a well-laid-out memory cell is governed by transistor area, rather than by wiring. Thus, in the same area, one can use larger access transistors in the CMMC than in a conventional cell, thereby providing larger access currents.

Figure 1:
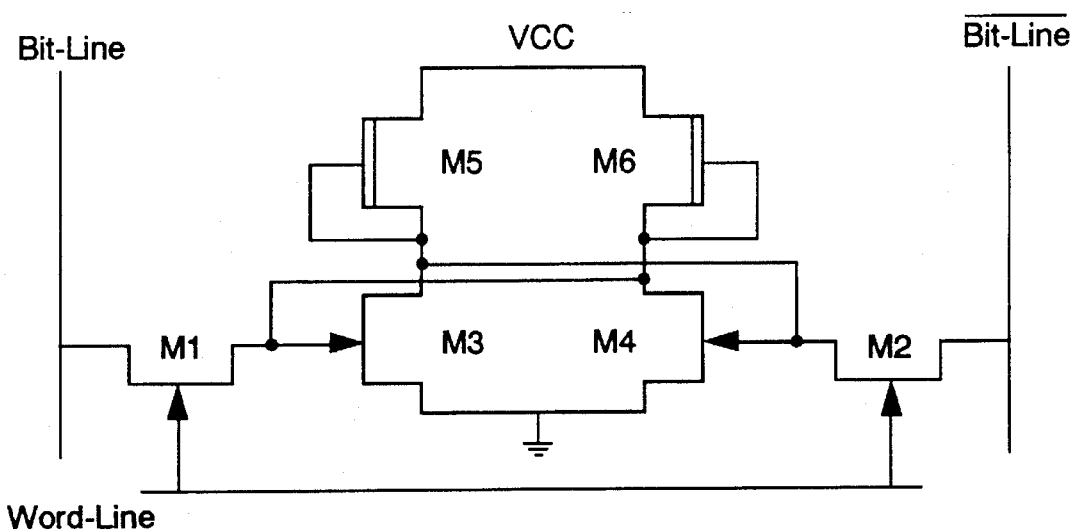
FIG. 1 is a schematic diagram of a conventional prior art memory cell.

The second reason is related to a limitation of the conventional memory cell. The following discussion assumes access transistors of equal size for both a conventional memory cell and the CMMC. The gate of the pass transistor in a conventional memory cell is biased by the word-line voltage (FIG. 1). This is usually clamped at one diode drop above ground to prevent destructive read operation. The source node of the pass transistor is connected to one of the storage nodes of the memory cell. As the pass transistor is made wider, more current is injected from the gate of the pass transistor into the cell. Both this noise current and the drain current of the access transistor cause the storage node voltages to shift, reducing the gate-source voltage applied to the access transistors.

Figure 4:
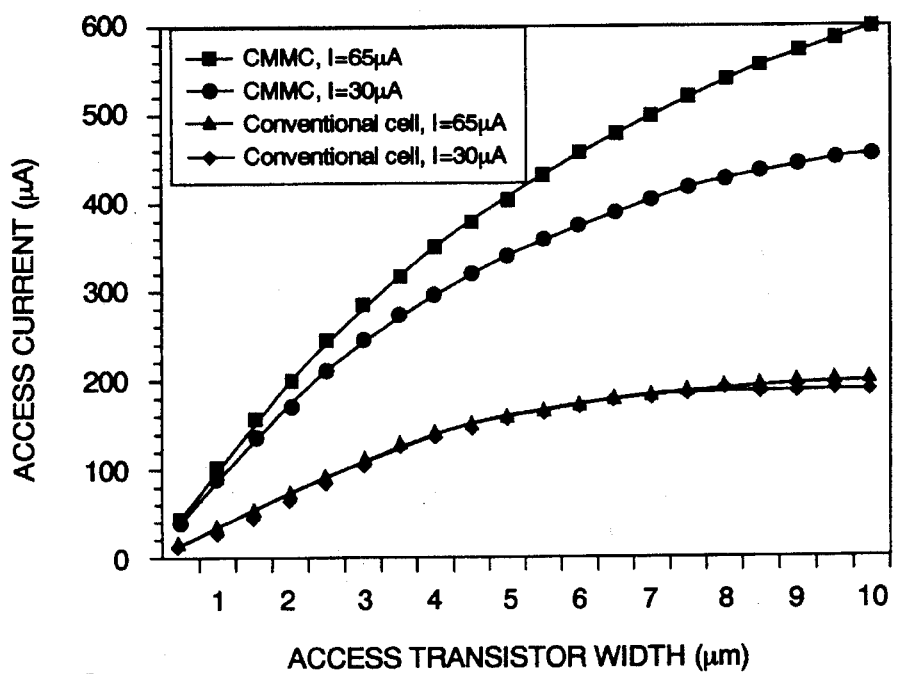
FIG. 4 is a graph illustrating simulated access currents for a conventional cell and the CMMC.

The access currents are shown in FIG. 4 as functions of pass transistor width. The memory cell driver transistors were scaled with the pass transistor size to maintain a three-to-one ratio. This graph shows that in conventional 6-transistor static RAMcells, when the width of the pass transistors exceeds 4 µm, the access current starts saturating with respect to transistor width, rather than scaling linearly with it. This saturation is the result of increased current injection and charge sharing.

In the CMMC, the gate of the access transistor is biased by the storage node voltage. This storage node is one diode drop above cell ground, which is close to circuit ground. The source node of this access transistor is biased by the word line which is pulled low, towards ground. As a result, the access transistor has a gate-to-source bias of:

$$V_{GS}(access) = V_{CS} + V_{CG} V_{WORD} \quad (2)$$

where $V_{CS}$ is the cell storage voltage (with respect to cell ground), $V_{CG}$ is the cell ground voltage and $V_{WORD}$ is the word line voltage at the cell.

Noise injection, which reduces the available access current in the conventional memory cell, is not a problem for this cell. In fact, the magnitude of access current can be further controlled by varying the cell ground bias with respect to the word-line bias, $V_{CG} - V_{WORD}$. This difference controls $V_{GS}(access)$ linearly (2), which affects the access current quadratically.

Figure 5:
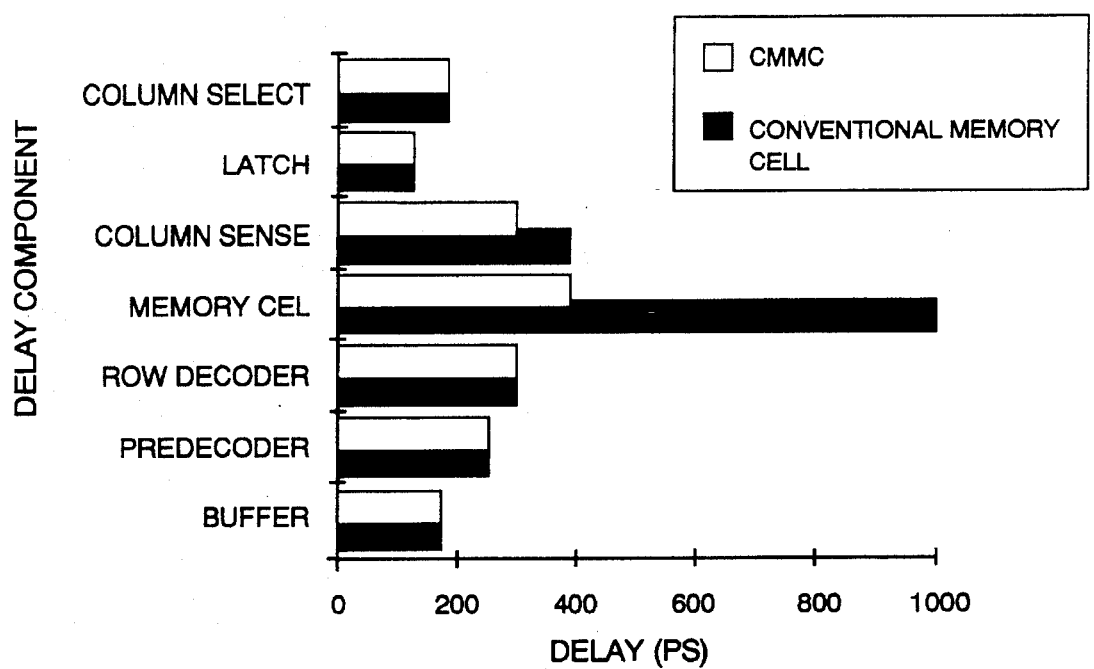
FIG. 5 is a graph illustrating delay comparisons for the access times of a 4kb SRAM using a conventional cell and the CMMC.

The impact of this larger access current on access time is shown in FIG. 5, which compares through simulation the delays of 4 kb SRAMs of similar area, based on a conventional cell and the CMMC. For this size SRAM, the new memory cell offers a 25% increase in overall speed. The impact is even more dramatic for larger SRAMs.

D. Adding Read Ports

Figure 13:
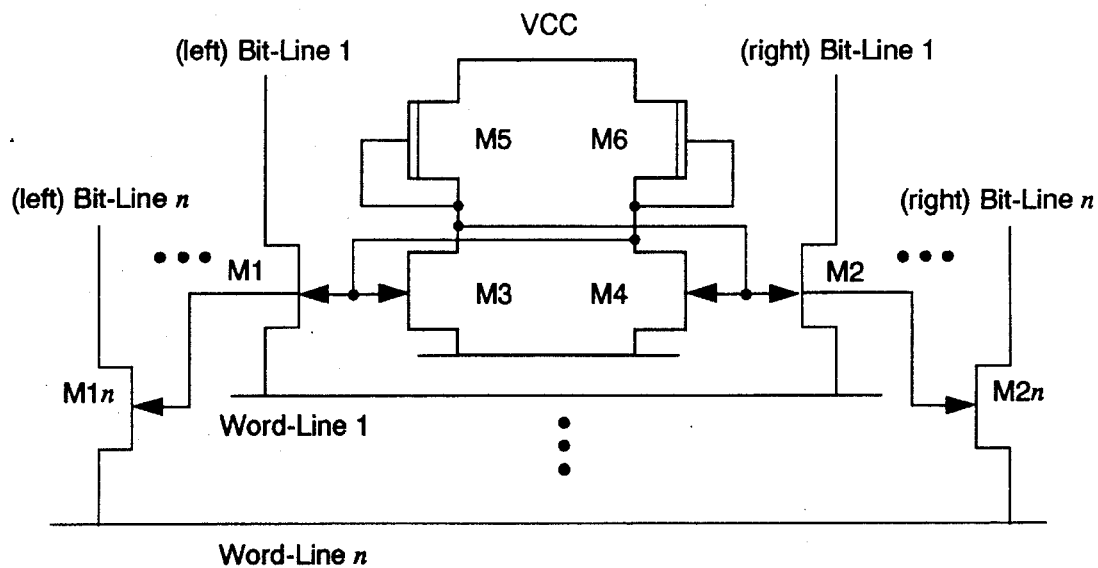
FIG. 13 is a schematic diagram illustrating an extension of the CMMC to multiple read ports.

Read ports can be added to a CMMC much more easily than to a conventional memory cell as illustrated in FIG. 13. Since the conventional memory cell is susceptible to destructive read problems, the cell current and driver transistor must be scaled when increasing the number of read ports. This scaling is required to prevent destructive read if all read ports of a cell are accessed simultaneously. The driver transistor and load devices of a multiport CMMC do not have to be scaled nearly as much as conventional cells, however, which results in a smaller memory cell.

Write Operation Of The CMMC

The technique used to write to the CMMC is quite different from the method used to write to a conventional memory cell. In a conventional cell, the following sequence of events occurs. First, the row to be written is selected by asserting that row's word line. After a suitable delay, one of the bit lines is pulled low while the other remains high. The low-voltage bit line is connected through one of the pass transistors to a cell storage node, pulling that storage node low and causing the opposite cell storage node to be driven high.

The technique used to write to a CMMC is based on clamping the cell storage node low using diodes, rather than forcing the node low through a pass transistor.

Figure 6A:
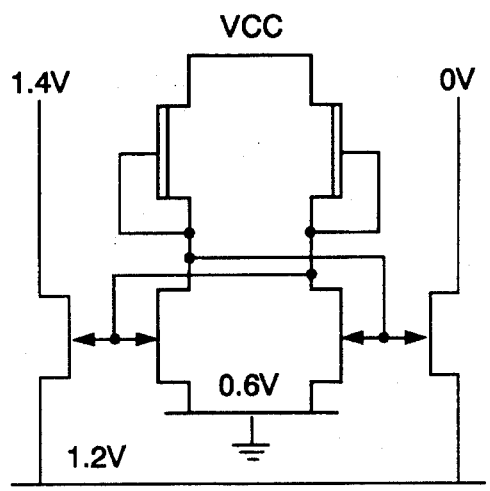
FIGS. 6a and 6b are schematic diagrams of CMMC cell bias during write for a selected cell for writing and other cells in a selected row, respectively.
Figure 7A:
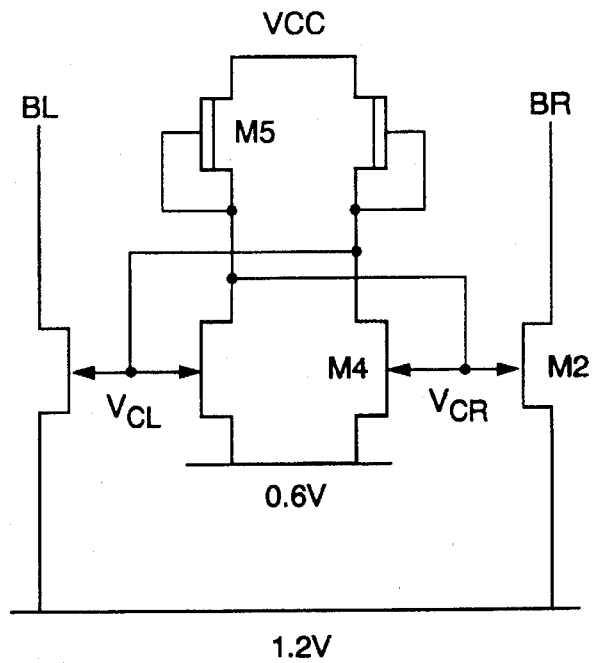
FIGS. 7a and 7b are schematic diagrams of the equivalent circuit of the CMMC during write illustrating memory cell bias and its equivalent circuit, respectively.

The biasing arrangement for the CMMC of the present invention during the WRITE operation is shown in FIG. 6a. A row is selected for writing by raising the cell ground line of the that row above its normal system ground bias to one diode drop above ground, or about 0.6 V. The word line remains at its standby bias of approximately 1.2 V. A cell is written by forcing one of its two bit lines low while leaving the other one high. To understand how this arrangement writes to the cell, consider the equivalent circuit presented in FIG. 7a. One half of the cell is presented in FIG. 7b.

After cell ground has been raised to one diode drop above ground, the cell storage nodes will be at about 0.7 V and 1.3 V. Since the word line is biased at approximately 1.2 V, the storage-node-to-word-line diodes of the access transistors will be off. The write action will take place through the storage-node-to-bit-line diode of the access transistor connected to the low bit line.

Figure 7B:
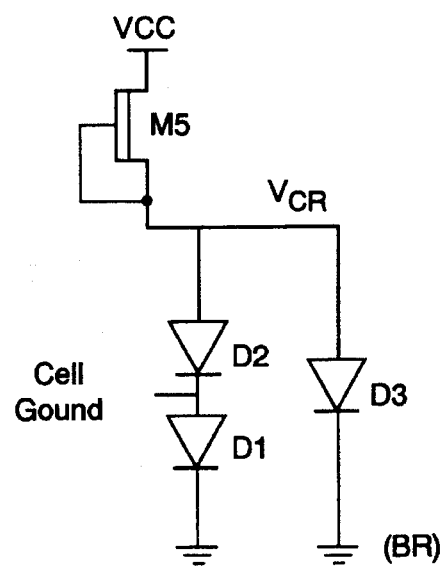

Transistor M5 is the depletion load feeding the gate of transistor M4. Diode D1 of FIG. 7b is the diode of the cell ground driver which has set cell ground to about 0.6 V. Diode D2 represents the gate-source diode of the latch pull-down transistor M4. The gate-drain diode of M4 has been omitted. Diode D3 represents the gate-drain diode of access transistor M2.

Figure 6B:
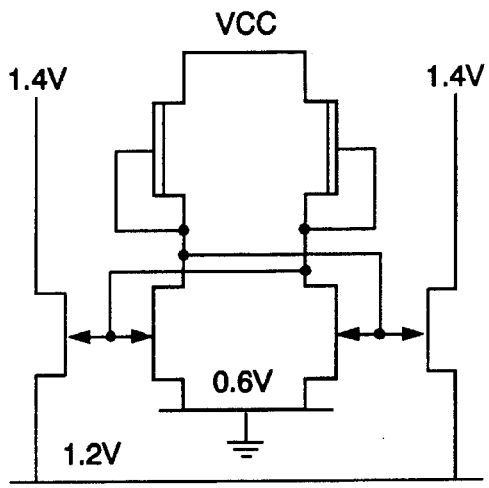

First, it is assumed that before writing, $V_{CR}$ was set to a logic high. When the cell ground is raised, $V_{CR}$ would be at approximately 1.3 V. When the bit-line is brought to ground, diode D3 turns on, clamping $V_{CR}$ at one diode drop above ground, or about 0.6 V, which is the same as cell ground. This causes a logic low to be stored on $V_{CR}$. The feedback of the latch causes $V_{CL}$ to be set to a logic high. To store a logic high on $V_{CR}$, bit line BL is brought low while leaving BR high. This causes $V_{CL}$ to be clamped low which sets $V_{CR}$ high. The biasing arrangement for cells in the selected row that are not being written to is shown in FIG. 6b. Since the word lines remain at their high levels and neither of the access transistor gate-drain diodes is turned on, the cells maintain their state.

Cells in unselected rows have their cell grounds held at 0 V. If either of the bit lines is brought low, the storage node to bit-line diodes will appear as additional diode loads in parallel with the driver transistor gate-source diodes. Hence, it is impossible to write to a memory cell that is not in a selected row.

Figure 8A:
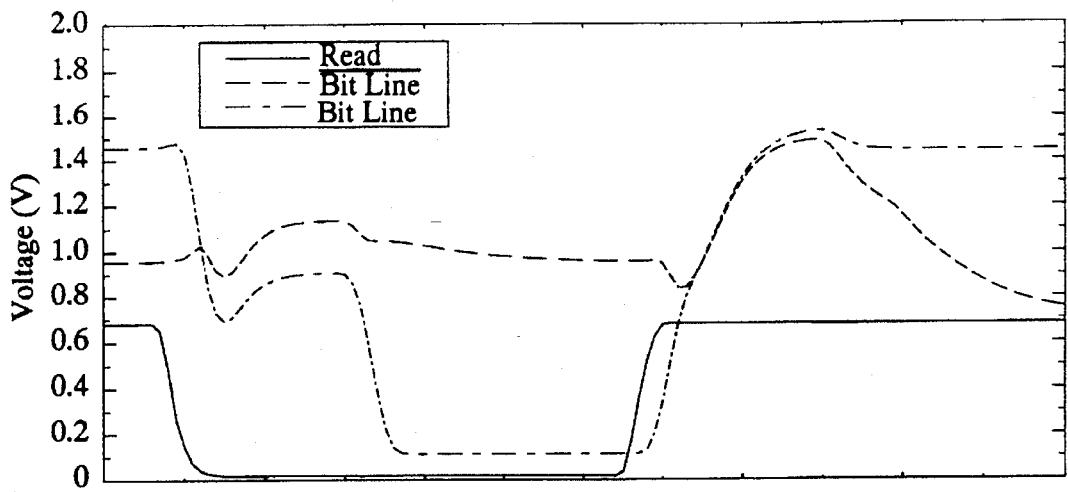
FIGS. 8a through 8c are timing diagrams for the read and write operations of the CMMC.
Figure 8B:
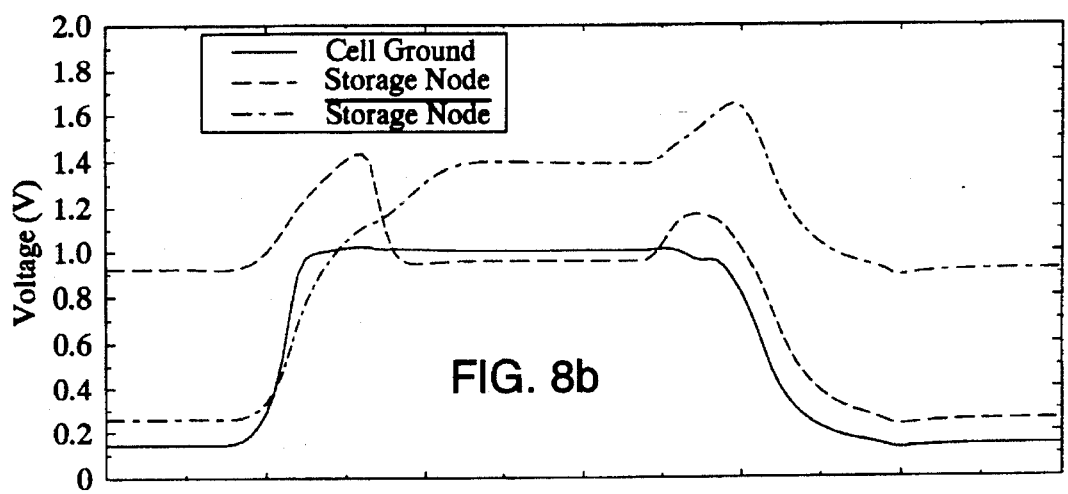
Figure 8C:
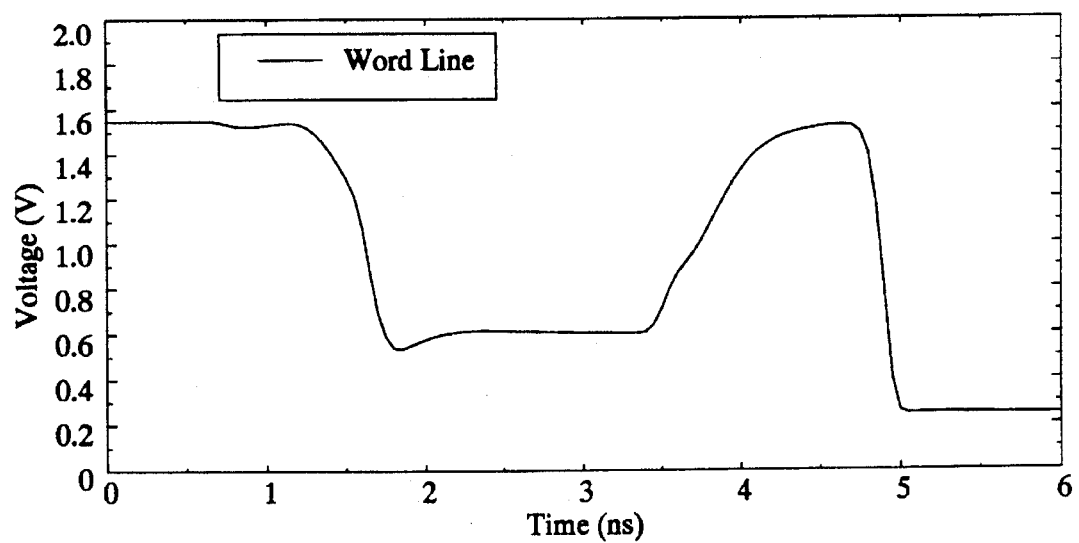

FIGS. 8a–8c are timing diagrams showing the state of the various control signals and cell storage nodes during a write and read operation. During the write operation, the read signal, which is shown in FIG. 8a, is first lowered. This causes the cell ground line of a selected row to rise, as shown in FIG. 8b, which in turn causes the memory cell storage nodes to rise. When one of the bit lines, shown in FIG. 8a, is brought down to ground, the memory cell storage node is clamped to cell-ground, causing the cell to be written. The write operation occurs here at approximately 1.7 ns.

FIG. 8c shows the word line. Initially, it is at a standby bias of approximately two diode drops above ground. During the write operation, the word line becomes coupled through memory cell access transistors to the low-voltage bit-lines. The memory cell storage nodes prevent the word line from dropping any lower than one diode drop above ground which prevents any erroneous write through the word line. At 4.8ns in this situation, the word line is brought low for a read, causing the bit lines to separate.

The process of writing to the CMMC eliminates a race condition which complicates conventional memory design. Pipelined logic systems often specify that reads and writes occur on opposite phases of a system clock. A race condition occurs at the transition from a read to the following write. If the bit lines of a column are pulled low for a write before the word line from the previous read has been turned off, data may be erroneously written to cells at the previous address. This hazard is avoided by delaying the bit line signals long enough that the word line signal of the row with the slowest address reaches the memory cell first. This hazard avoidance can cost a significant fraction of the entire cycle time and make the write path the critical speed path.

The CMMC can only be written if the cell ground line is raised to one diode drop above ground. During a read, all cell grounds are at system ground. Thus, it is not possible to write erroneously to the cell at the address of the previous read. Since data cannot be mistakenly destroyed, there is no need to delay the bit line signals with respect to the row decode.

The write operation was described assuming that the cell ground was raised first, before the bit lines were pulled low. It does not matter which signal, the cell ground line or the bit-line signal, reaches the cell first. Since the bit line signals do not need to be delayed with respect to the word line or cell ground signals, simple asynchronous SRAM designs can be used in place of synchronous or self-timed designs.

The drawbacks of this memory cell are that cell grounds must be driven, and that additional write ports are expensive to add. The write signal for the cell is associated with the cell ground that is common to the entire row rather than a signal associated with a pair of access transistors. Thus, additional write ports would have to be added using pass transistors similar to those used in conventional memory cells. Fortunately, most applications for embedded memory require multiple read ports with only one write port.

Transferring data from the bit-lines to the cell usually occupies a significant portion of the total write time. The mechanism for writing to a conventional cell involves discharging the storage node through a pass transistor. The resistance of the channel of a transistor is a non-linear function of the drain-source voltage and is given in the region of operation (we are neglecting the $1+\lambda V_{DS}$ term) by:

$$r_{ds} = \frac{\partial V_{DS}}{\partial I_{DS}} = \left( \frac{\partial}{\partial V_{DS}} (K \cdot (V_{GS} - V_{TH})^2 \cdot (1 + b (V_{GS} - V_{TH})^{-1}) \cdot \tanh(\alpha V_{DS})) \right)^{-1} \quad (3)$$

$$= \frac{\cosh^2(\alpha V_{DS})}{K \cdot \alpha \cdot ((V_{GS} - V_{TH})^2 - (1 + b (V_{GS} - V_{TH})^{-1}))}$$

As a cell is being written, $V_{DS}$ of the access transistor is reduced, resulting in a lower channel resistance. The method used to write to the CMMC involves discharging the storage node through a Schottky diode, which has a resistance given by:

$$r_{gs} = \frac{\partial V_{GS}}{\partial I_{GS}} = \left( \frac{\partial}{\partial V_{GS}} I_o \cdot \left( \exp\left(\frac{qV_{GS}}{nkT}\right) - 1 \right) \right)^{-1} \quad (4)$$

$$= \frac{nkT}{qI_{GS}} = \frac{2nkT}{qI_{CELL}}$$

The resistance of the Schottky access transistor diode is inversely proportional to the cell current.

Figure 9:
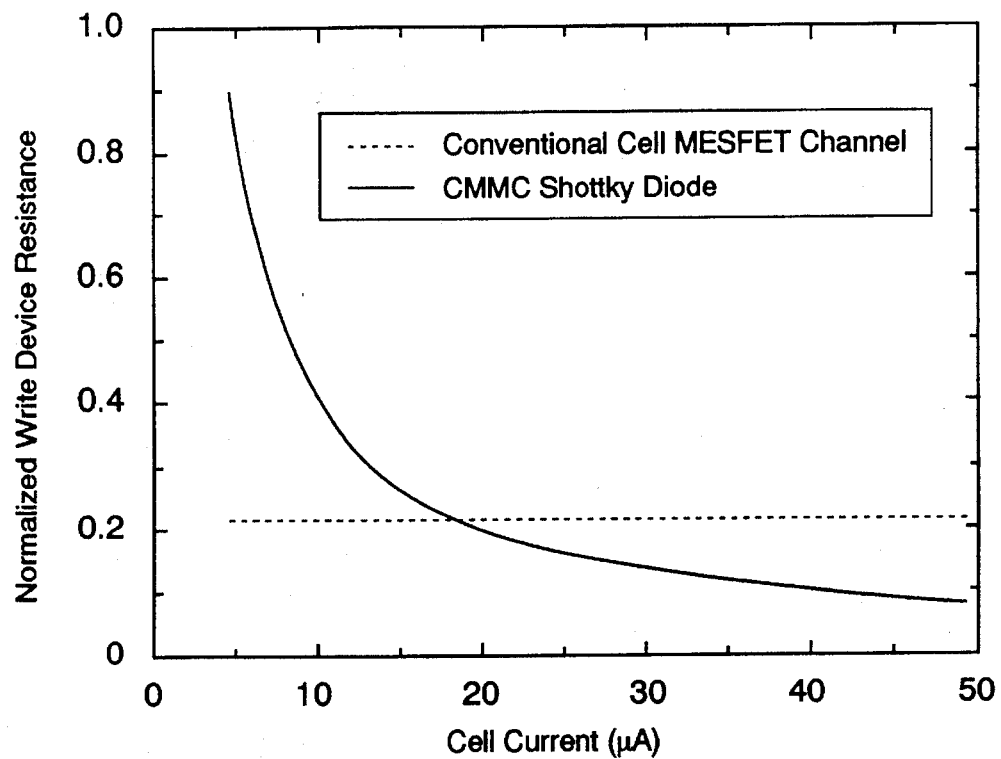
FIG. 9 is a graph comparing Schottky diode and MESFET channel resistance.

A normalized comparison of the on-resistance of the CMMC Schottky write diode and the on-resistance of a MESFET channel averaged over the write time is shown as a function of cell current in FIG. 9. This simulation was performed using 4 µm wide access transistors for both cells. For cell currents above 20 µA, the CMMC exhibits smaller write-device on-resistance and thus faster write times. Below this level, conventional cells can achieve faster write times. For cell currents below 10 µA, leakage currents within a cell become much more important and can upset the state of the cell.

SRAM Utilizing The CMMC

An asynchronous 1 kb SRAM was designated to develop and demonstrate the CMMC. The chip was fabricated through MOSIS in the Vitesse H-GaAs III, 4-metal, 0.6 µm E/D MESFET technology.

The primary reason for making the design asynchronous was to satisfy the small-memory needs of a GaAs microprocessor system. The asynchronous design is able to provide sub-2ns access times for design sizes to 4 kb. The relaxed timing constraints of the CMMC facilitate rapid prototyping of RAMs of different configurations and even different process technologies, without concern about read after write hazards or the need to generate self-timed pulses.

Figure 10:
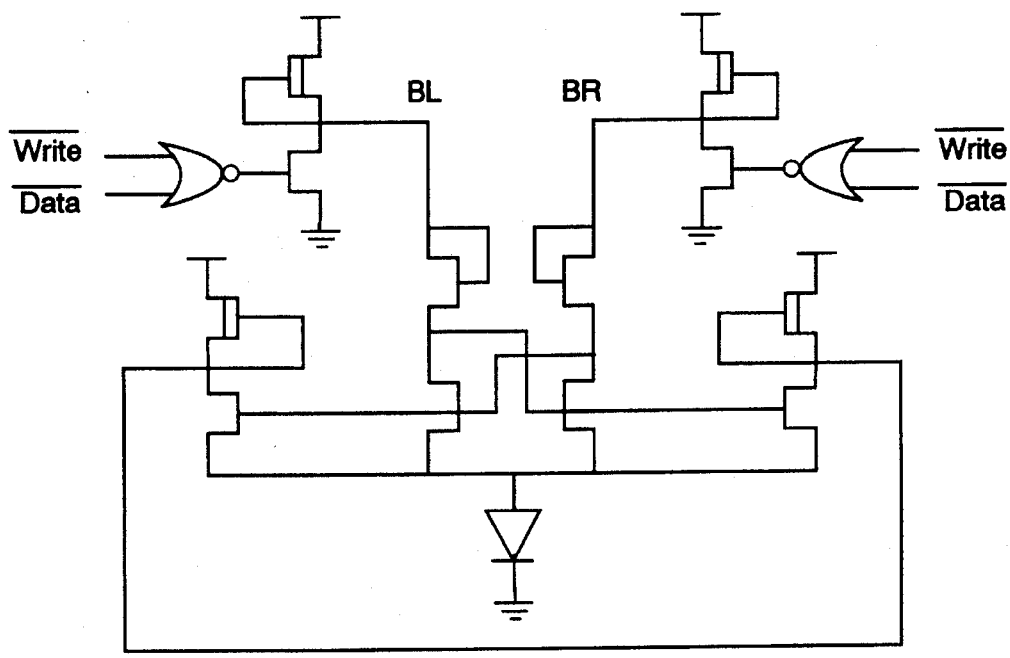
FIG. 10 is a schematic diagram of a sense amplifier and write circuitry.
Figure 11:
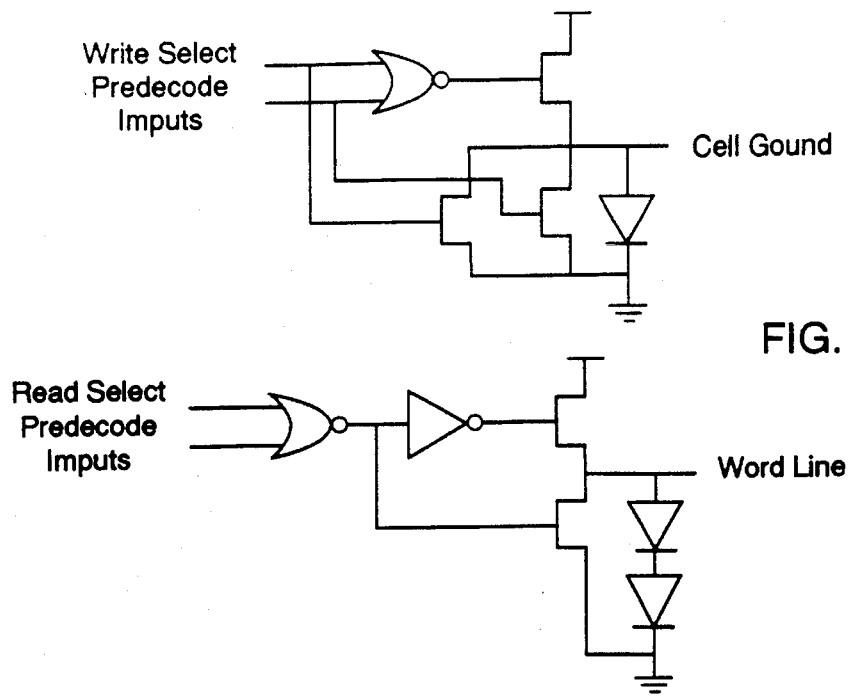
FIG. 11 is a schematic diagram of cell-ground and word-line drivers.

The column circuitry of this SRAM, including sense amplifiers and write drivers, is shown in FIG. 10. To minimize the impact of process variations on the functionality of the sense amplifier, it was made primarily of enhancement transistors. The cell ground and word line drivers used in this RAM are shown in FIG. 11. In more recent implementations of the word drivers, the two diodes have been omitted. This achieves identical performance at lower power dissipation. In memories that have been implemented which have a larger number of bits per column, the cell ground driver is designed to raise the cell ground line to about 1.0 V instead of just 0.6 V to ensure adequate write margins. Most of the high capacitance drivers in the predecode logic and signal buffers in the RAM are made from enhancement-type superbuffers.

A number of chips were packaged and tested. The chips were tested on a Hewlett-Packard 82000 IC Evaluation System. A number of different functional tests were run to uncover different types of faults. In the first test, all memory locations were first written with ones. All locations were then read. This procedure was then repeated by writing and then reading all zeros. The purpose of this test was to uncover any stuck columns. The second test was a checkerboard pattern. The purpose of this test was to uncover any slow columns and/or stuck bits that were not found in the first test. In the third test, the entire memory array was filled with zeros. A single row was subsequently written with all ones. All rows and columns were then read. The purpose of this test was to determine whether the leakage currents of all rows filled with zeros were enough to prevent correct writing or reading of the row to be filled with ones.

The test results are summarized in Table I.

TABLE I

| PARAMETER | VALUE |
| --- | --- |
| Organization | 32 × 32 |
| I/O Levels | GaAs/ECL |
| Supply Voltage | 2V |
| Cell Size | 350 μm² |
| Cell Current | 60 μA |
| Chip Size | 1.3mm × 1.1mm |
| Address Access Time | 1.0ns – 2.3ns |
| Write Time | 1.0ns |
| Power Consumption | 800 mW |

Figure 12A:
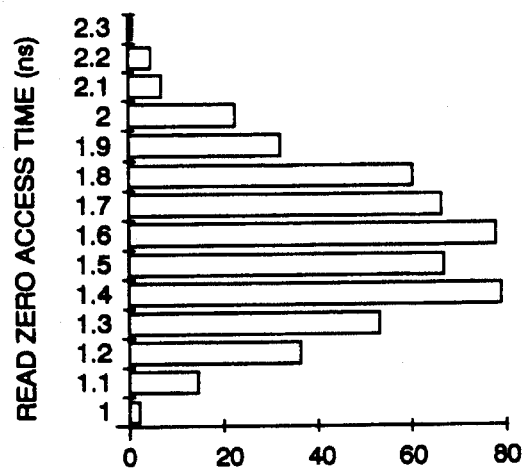
FIGS. 12a and 12b are graphs illustrating measured read access time scattering for a 1 kb SRAM of the present invention.
Figure 12B:
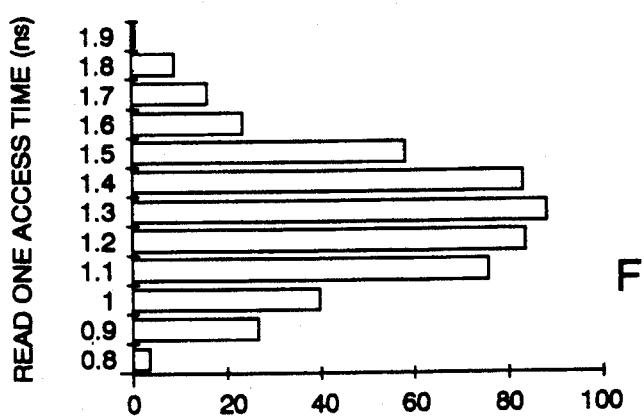

Address access times were measured over 512 bits of the fully functional chips. Histograms of the access times for reading a one and a zero for one of these chips are given in FIGS. 12a and 12b. These delays are on-chip delays, and were obtained by measuring the raw delays and subtracting measured input-pad to output-pad delays. The measured data show bit access time scattering from 1.0 ns to 2.3 ns, with an average address access time of 1.56 ns and standard deviation 250 ps. The HSPICE simulated access time was 1.2 ns using typical parameters. Most of the access time variation was observed between columns rather than within columns. The source of this variation is probably process variations in the sense amplifier. A write pulse of width 1.0 ns was adequate to write successfully to all bits.

SUMMARY

The memory cell of the present invention allows much faster static random access memories in GaAs using MESFETs. This memory cell benefits high speed integrated circuit designers who design memories in GaAs. It will also be beneficial to CAD tool vendors for integration into the design packages that they sell to integrated circuit designers. The applications for this new memory cell include computer CPUs with cache RAM, test equipment, graphics and signal processors.

A conventional memory cell, as illustrated in FIG. 1, requires a driver transistor that is 3 times larger than the access transistor to prevent destructive readout. To achieve high access speeds, it is desirable to have as large an access transistor (M1,M2) as possible. Since the only functional purpose of the driver transistor is to maintain the state of the cell, conventional cells are made of larger than necessary driver transistors and smaller than desired access transistors. The current mirror memory cell (i.e. CMMC) of FIG. 2 is immune to the destructive readout problems of conventional memory cells. Hence, minimum-sized drivers can be used while the access transistors can be scaled independently of the driver. The biasing arrangement for reading this cell is shown in FIGS. 3a and 3b.

The access times of large memory arrays is very dependent on the ability of memory cells to deliver large access current to swing the bit-lines. The access transistor of the CMMC is biased locally by the storage cell itself and is not hindered by the charge sharing that limits the amount of access current that can be delivered by a conventional cell. FIG. 4 shows how access current scales with pass transistor size for a CMMC and a conventional cell of two different cell currents. The effect of charge sharing in the conventional cell is evident in the access current saturation. Secondary effects cause milder saturation for the CMMC. The impact of the larger access currents on access time is shown in FIG. 5 where the delay of a 4 kb SRAM of similar size based on a conventional cell and a CMMC. For this size SRAM, the new memory cell offers a 25% increase in overall speed. The impact is more dramatic for larger SRAMs.

The new memory cell is written, as illustrated in FIGS. 6a, 6b, 7a and 7b, by raising the cell ground line, which in turn raises the cell storage nodes. One of the bit lines is pulled low, which has the effect of clamping the storage node through the gate-drain diode of the access transistor (D3). This technique is much faster than the conventional writing technique because the data is written almost immediately when both the cell ground and bit line signals reach the cell. A conventional cell can require as much as 500 ps to discharge the memory cell through the access transistors. This biasing technique also eliminates a race condition that exists in conventional SRAMs. The order of the arrival of bit line and cell ground signals to a cell is not important and will not corrupt previously read data in other rows.

A further advantage of this new memory cell is that it provides larger low voltage noise margins than a conventional cell. The increase can be as much as 150 mV.

In addition to the larger access currents, faster access speeds, non-destructive read and faster write times, the biasing arrangement during readout minimizes the impact of leakage currents on the number of bits that can be safely connected to a column. Measurements indicate this SRAM can work with up to 512 bits per column at 75° C.

Figure 14:
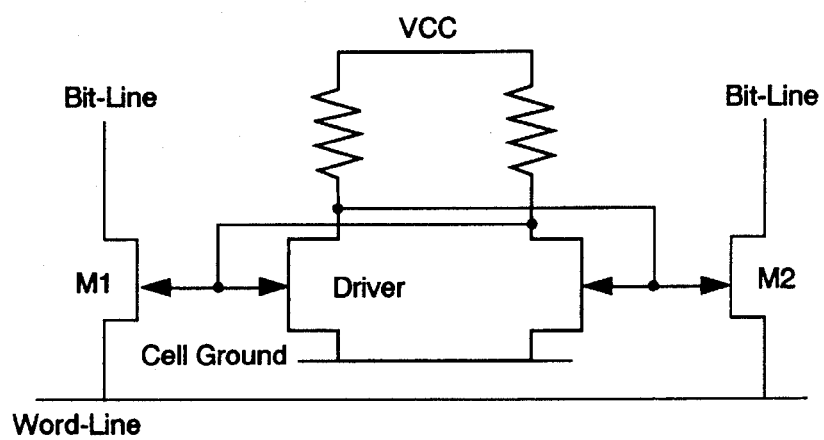
FIG. 14 is a schematic diagram of an alternative embodiment of the CMMC having resistive pull-up devices rather than depletion loads.

An obvious extension to this RAM cell is the addition of extra read ports as shown in FIG. 13. Alternate implementations of the new cell can be made by replacing the depletion load devices shown in FIGS. 2, 3a, 3b, 6a, 6b, 7a, 7b and 13 with resistive pull-up devices as illustrated in FIG. 14.

While the best mode for carrying out the invention has been described in detail, those familiar with the art to which this invention relates will recognize various alternative designs and embodiments for practicing the invention as defined by the following claims.

What is claimed is:

1. A memory cell for use in a GaAs circuit, the cell comprising:

two storage nodes for storing charge and each having a voltage;

two access transistors coupled to the storage nodes, each of the access transistors having a source, a gate and a drain;

two driver transistors coupled to the access transistors, each of the driver transistors also having a source, a gate and a drain wherein each of the access transistors is adapted to be biased as a current mirror to its associated driver transistor so that a gate-source voltage of each driver transistor is substantially the same as a gate-source voltage of its associated access transistor during a read operation from the cell; and a cell ground line connected to the sources of the driver transistors and having a variable voltage to allow a write operation to the cell to occur at a first voltage and to allow the read operation from the cell to occur at a second voltage lower than the first voltage.

2. The cell as claimed in claim 1 further comprising a word line connected to each of the access transistors which are adapted to be biased by the word line so that when the word line is pulled low toward ground, each of the access transistors has a gate-source voltage defined by the equation:

$$V_{GS}(access) = V_{CS} + V_{CG} - V_{WORD}$$

where $V_{CS}$ is a cell storage voltage (with respect to cell ground voltage), $V_{CG}$ is voltage at the cell ground line and $V_{WORD}$ is voltage at the word line of the cell.

3. The cell as claimed in claim 1 wherein the first voltage is at least one diode drop above cell ground voltage during a write operation.

4. The cell as claimed in claim 1 further comprising bit lines connected to the access transistors wherein when the voltage of the word line is raised above the voltages of the storage nodes, the access transistors are turned off and leakage currents associated with the access transistors and flowing from the bit lines are minimized.

5. The cell as claimed in claim 1 wherein the cell includes more than the two access transistors.

6. The cell as claimed in claim 1 further comprising means for maintaining the charge on the storage nodes.

7. The cell as claimed in claim 6 wherein the means for maintaining includes a pair of gate-to-source connected depletion pull-up transistors.

8. The cell as claimed in claim 6 wherein the means for maintaining includes a pair of resistive loads.

* * * * *

UNITED STATES PATENT AND TRADEMARK OFFICE
CERTIFICATE OF CORRECTION

PATENT NO. : 5,490,105

DATED : February 6, 1996

INVENTOR(S) : AJAY CHANDNA ET AL.

It is certified that error appears in the above-indentified patent and that said Letters Patent is hereby corrected as shown below:

Title page; In the References cited add the following reference as listed on Form PTO 1449 --A. Fiedler et al. "A GaGas 356 x 4 Static Self-Timed Random Access Memory" IEEE GaAs IC Symposium Tech. Digest, November 1986--;

Column 2, line 3
in the equation "$V_{GS}(access)-V_{CS}$" should be --$V_{GS}(access)=V_{CS}$--;

Column 3, line 18 after "transistors" insert --(M1, M2)--;

Column 3, line 19 after "transistors" insert (M3, M4)--.

Column 4, line 44
in equation 1, replace "$1+v(V_{GS}-V_{th})$" with --$1+b(V_{GS}-V_{th})$--; and Column 5, line 25
in equation 2, replace "$\bar{V}_{GS}(access)-V_{CS}+V_{CG}V_{word}$" with --$V_{GS}(access)=V_{CS}+V_{CG}-V_{word}$--.

Signed and Sealed this

Thirtieth Day of July, 1996

Attest:

BRUCE LEHMAN

*Attesting Officer*    *Commissioner of Patents and Trademarks*

UNITED STATES PATENT AND TRADEMARK OFFICE
CERTIFICATE OF CORRECTION

PATENT NO. : 5,490,105

DATED : February 6, 1996

INVENTOR(S) : Ajay Chandna et al.

It is certified that error appears in the above-identified patent and that said Letters Patent is hereby corrected as shown below:

Column 1, line 5

-- This invention was made in part with Government support under Grant No. DAAL 03-90-C-0028 from the Department of the Army. The U.S. Government has certain rights in this invention.--

Signed and Sealed this

Twelfth Day of November, 1996

Attest:

BRUCE LEHMAN

Attesting Officer     Commissioner of Patents and Trademarks